(12) United States Patent
Ong et al.

(10) Patent No.: US 7,745,234 B2
(45) Date of Patent: Jun. 29, 2010

(54) METHOD FOR RECLAIMING SEMICONDUCTOR PACKAGE

(75) Inventors: King Hoo Ong, Shanghai (CN); Robertito Piaduche, Shanghai (CN); Ning Ye, San Jose, CA (US); Hem Takiar, Fremont, CA (US)

(73) Assignee: SanDisk Corporation, Milpitas, CA (US)

( * ) Notice: Subject to any disclaimer, the term of this patent is extended or adjusted under 35 U.S.C. 154(b) by 81 days.

(21) Appl. No.: 12/165,383

(22) Filed: Jun. 30, 2008

(65) Prior Publication Data

US 2009/0325321 A1 Dec. 31, 2009

(51) Int. Cl.
*H01L 21/70* (2006.01)
(52) U.S. Cl. .................. 438/4; 257/E21.532
(58) Field of Classification Search ........... 438/4; 257/E21.532
See application file for complete search history.

(56) References Cited

U.S. PATENT DOCUMENTS 6,002,178 A * 12/1999 Lin ........................ 257/778
6,249,052 B1 * 6/2001 Lin ........................ 257/737
7,569,923 B2 * 8/2009 Meir ....................... 257/693

\* cited by examiner

*Primary Examiner*—Matthew Smith
*Assistant Examiner*—Walter H Swanson
(74) *Attorney, Agent, or Firm*—Vierra Magen Marcus & DeNiro LLP

(57) ABSTRACT

A method of forming a semiconductor card. A semiconductor package having a damaged controller die is reclaimed. The reclaim process includes severing the electrical connections between the controller die and the semiconductor package substrate without exposing the passive component. In one embodiment, the cutting tool comprises a saw blade. An electrically insulating material is deposited over the exposed bond wires to complete the reclaim process. The reclaimed package and a new controller die are affixed to a second substrate to electrically couple the memory die of the reclaimed package with the new controller die—forming a new package. The new package is encapsulated to form a new memory card.

24 Claims, 7 Drawing Sheets

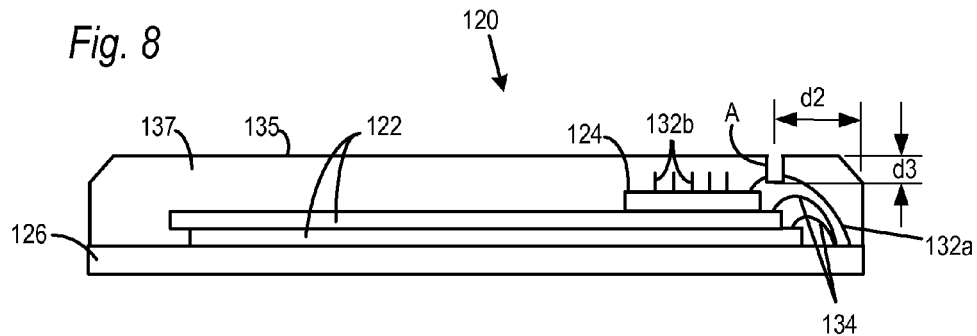
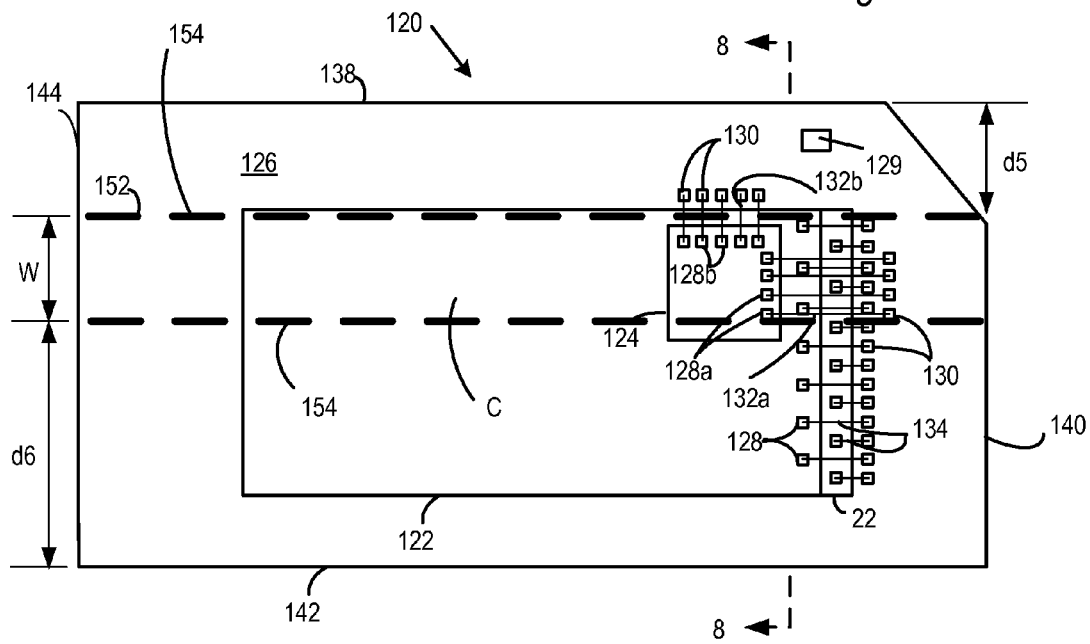

METHOD FOR RECLAIMING SEMICONDUCTOR PACKAGE

FIELD OF THE TECHNOLOGY

Embodiments of the present technology relate to methods for reclaiming a memory die in a damaged semiconductor package, and forming a new memory card using the reclaimed semiconductor package.

BACKGROUND

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

Cross-sectional side, top and bottom views of a conventional semiconductor package 20 are shown in FIGS. 1 and 2A and 2B, respectively. (molding compound has been omitted from FIG. 2A). Referring initially to FIGS. 1 and 2A, conventional packages include a plurality of semiconductor die, such as flash memory die 22 and controller die 24, affixed to a substrate 26. A plurality of die bond pads 28 may be formed on the semiconductor die 22, 24 during the die fabrication process. Similarly, a plurality of contact pads 30 may be formed on the substrate 26. Memory die 22 may be affixed to the substrate 26, and then controller die 24 may be mounted on die 22. All die may then be electrically coupled to the substrate by affixing bond wires 32 between respective die bond pad 28 and contact pad 30 pairs. The substrate may include a copper layer etched into electrical leads for transmitting signals and data to and from the die 22 and 28. Once all electrical connections are made, the die and bond wires may be encapsulated in a molding compound 34 to seal the package and protect the die and bond wires.

The controller die 24 is generally smaller than the memory die 22. Accordingly, the controller die 24 is conventionally placed at the top of the memory die stack. In FIGS. 1 and 2A, the die bond pads 28 of memory die 22 all bond out to a single, side edge of the substrate 26. The controller die bond wires 32 are shown bonded between bond pads 28a and a separate row of contact pads 30 along the same edge. The controller die 24 is also wire bonded between a second row of die bonds pads 28b along an adjacent edge of the controller die 24 and a second row of contact pads 30.

Referring now to the bottom view of FIG. 2B, the package 20 may be a land grid array (LGA) package including a plurality of contact fingers 40 etched into the copper layer on the back side of the substrate. The fingers 40 allow the package 20 to be removably used within a slot of a host device. A plurality of test pads 42 are also defined in the copper film on the back side of the substrate 26 to allow electrical test and debug of the package upon completion. The test pads 42 are typically covered up once the electrical test is completed. The number of contact fingers 40 and test pads 42 shown in FIG. 2B is by way of example and may vary. Vias (not shown) are formed through the substrate 26 to allow electrical connection of the die through the substrate to the contact fingers 40 and test pads 42.

In testing finished semiconductor packages, there will be some number of packages that fail due to a problem with the controller die in the package. Instead of throwing away the entire package, it is known to "reclaim" the package by electrically isolating the controller die 24 within the package and repackaging the memory die in a new semiconductor package. Today, the controller die 24 is electrically isolated from the substrate 26 by mechanically grinding off the molding compound 34 on the top of the package 20 until the wires 32 connecting the controller die 24 to the substrate 26 are exposed and severed. The grinding equipment is typically either custom designed or is a non-standard piece of semiconductor equipment used in the machining shop with very low units per hour. Regardless of the equipment, the grinding is carried out in an uncontrolled environment and does not provide adequate grinding depth control.

Mechanical grinding also introduces mechanical stresses on the memory die 22, which may crack or otherwise damage one or more of the memory die 22. The grinding also reduces the original package thickness, which weakens the package structure and complicates downstream surface mount technology (SMT) processes due to non-standard package thickness. The grinding process may also expose the passive components in the package (not shown), which have a vertical height above the substrate 26 approaching that of the controller die bond wires 32.

SUMMARY

One aspect of the present technology is to reclaim a semiconductor package. In one embodiment, a semiconductor dicing saw blade severs the bond wires electrically connecting the controller die to the substrate. The saw blade cuts through a portion of the package surface along a first edge of the controller die to sever one set of the bond wires electrically coupling the controller die with the package substrate. The semiconductor saw blade may make a second cut through a portion of the package surface along a second edge of the controller die to sever the remaining portion of the bond wires electrically coupling the controller die with the package substrate. In an alternative embodiment, the semiconductor dicing saw may instead sever all bond wires electrically coupling the controller die with the package substrate in a single pass over the package. The semiconductor saw blade does not sever the electrical coupling between the one or more memory die and the package substrate. The exposed bond wires between the controller die and substrate are next covered with an electrically insulating material. In an alternative embodiment, a laser may be used (instead of a dicing saw blade) to cut through a portion of the package surface to sever the bond wires electrically coupling the controller die to the package substrate.

A further aspect of the present technology is to form a new semiconductor package using the reclaimed semiconductor package. In one embodiment, a reclaimed semiconductor package is affixed to the surface of a second new substrate. The reclaimed package is electrically coupled to the second substrate by surface mounting the exposed test pads of the reclaimed package to contact pads on the second substrate. The test pads of the reclaimed semiconductor package electrically couple the memory die of the reclaimed semiconductor package with the second substrate. A second controller die is also affixed to and electrically coupled with the second substrate. The second substrate, with the reclaimed semiconductor package and second controller die affixed, is encapsulated in an electrically insulating molding compound to form a finished semiconductor package.

BRIEF DESCRIPTION OF THE DRAWINGS

FIG. 8 depicts a cross-sectional side view of a semiconductor package that has been cut along path B shown in FIG. 6.

FIG. 9 depicts a top view of a semiconductor package showing a single cut path C.

DETAILED DESCRIPTION

Embodiments will now be described with reference to FIGS. 3-14, which relate to reclaiming a memory die in a damaged semiconductor package and mounting the reclaimed package within a new semiconductor package. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

As indicated in the Background section, memory cards may fail final testing for several reasons. Embodiments described hereinafter relate to novel methods for reclaiming semiconductor packages which fail due to a faulty controller die. For the purpose of describing this technology, the reclaimed semiconductor packages may come from a variety of different types of semiconductor packages such as those used for, but not limited to, secure digital cards, compact flash cards, memory sticks, universal serial bus (USB) flash drives, USB storage devices, and the like.

Figure 1:
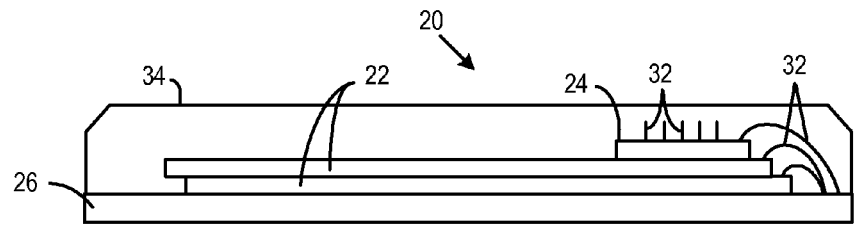
FIG. 1 depicts a cross-sectional side view of a conventional semiconductor package.
Figure 2A:
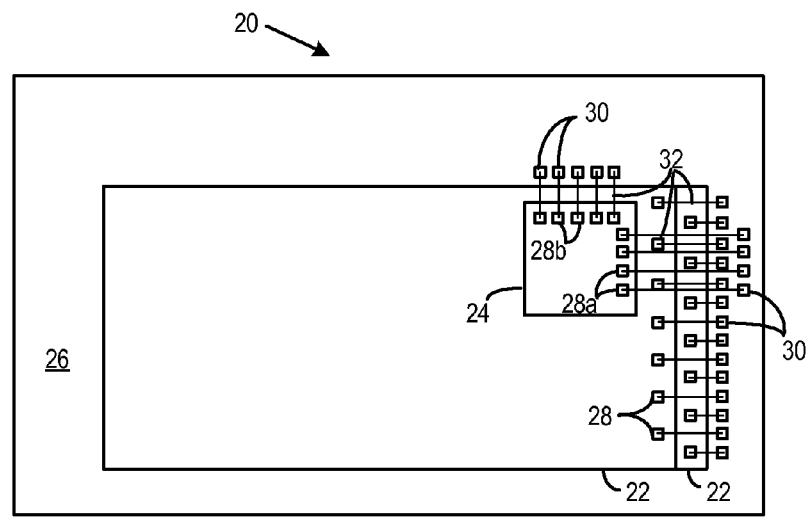
FIG. 2A depicts a top view of a conventional substrate and wire bonded semiconductor die.
Figure 2B:
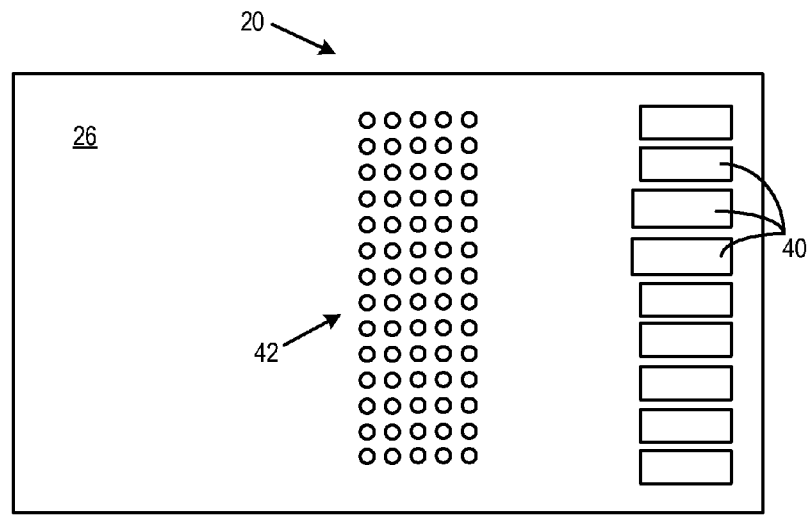
FIG. 2B depicts a bottom view of a conventional substrate including contact fingers and test pads.
Figure 3:
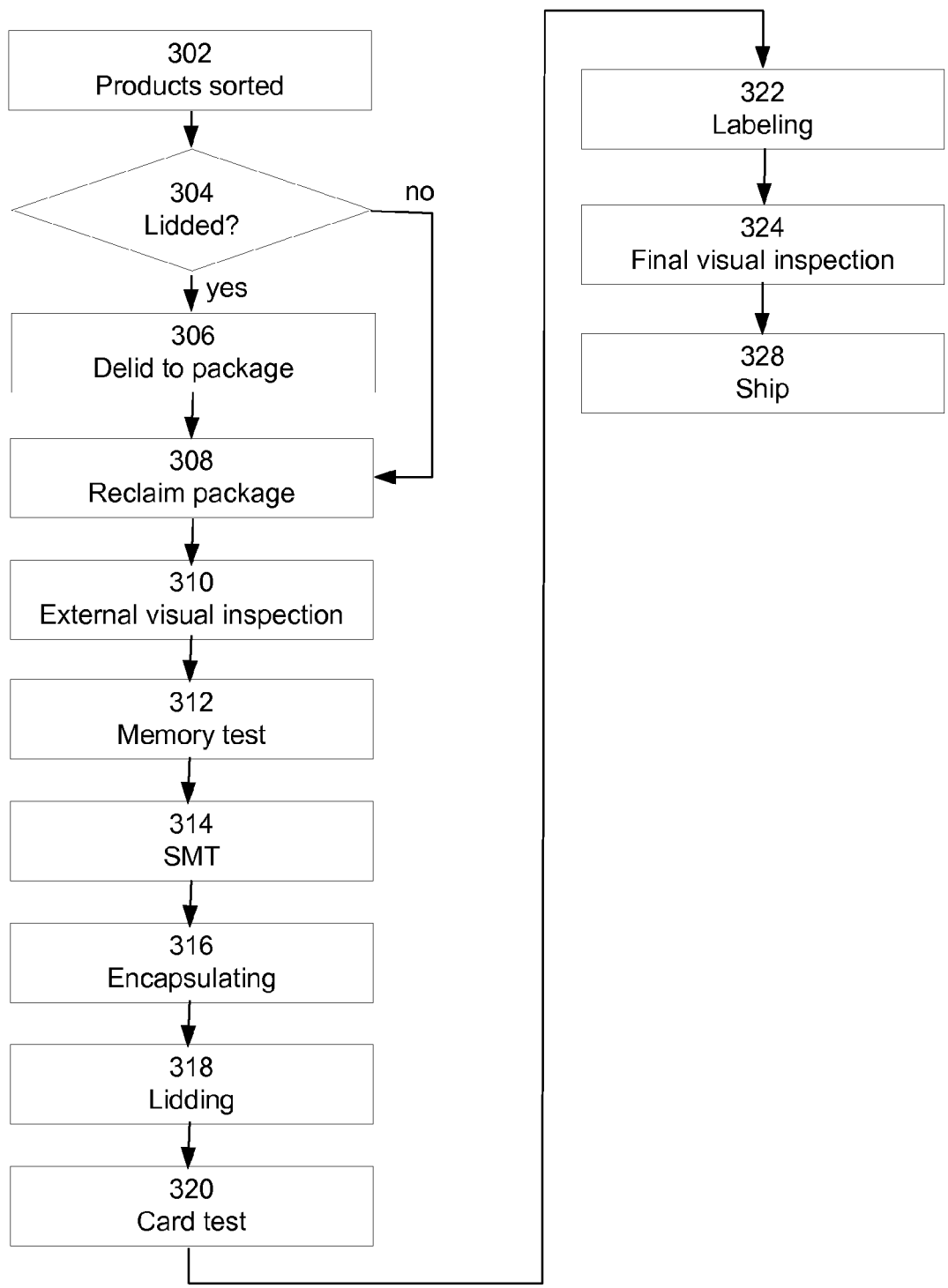
FIG. 3 depicts a flowchart displaying exemplary steps of a fabrication process for forming a new memory card.

FIG. 3 illustrates exemplary steps of a fabrication process for forming a new semiconductor card using a reclaimed semiconductor package. A semiconductor package, once assembled, is subjected to a variety of electrical tests to determine if it functions properly. As is known in the art, such testing may include electrical testing, burn in and other tests. If the controller die fails during the testing process, the package cannot be used. In step 302, the memory cards which are determined to have faulty controller die are sorted from those which do not.

In step 304, it is determined whether the flash memory card (which has been sorted into the "failed" group) is lidded. If the flash memory card is lidded, the lid is removed from the flash memory card, in step 306 (a flash memory card without a lid is referred to as a "flash memory package" or "semiconductor package"). Once the lid of the flash memory card is removed (or if the flash memory card did not have a lid to begin with), the flash memory package is reclaimed, in step 308. As will be discussed in more detail later, the controller die 124 in the damaged semiconductor package 120 is electrically isolated from the substrate 126, in step 308.

Figure 6:
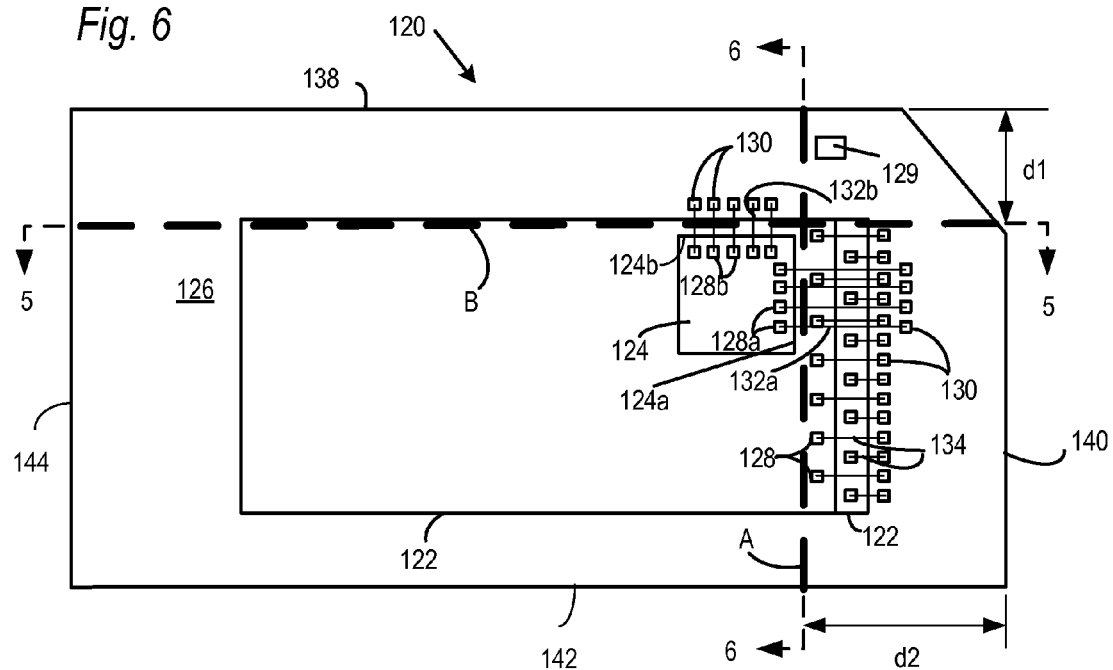
FIG. 6 depicts a top view of a semiconductor package showing a cut path A and a cut path B.

Step 308 is explained in greater detail with reference to the top and edge views of FIGS. 6-10 and the flowchart of FIG. 4. FIG. 6 illustrates a semiconductor package 120 (with molding compound omitted for description purposes only). The semiconductor package 120 includes a pair of flash memory die 122, a controller die 124, a substrate 126 and a passive component 129 (e.g., a capacitor). Die bond pads 128 are formed on both the memory die 122 and the controller die 124 during a known die fabrication process. Similarly, a plurality of contact pads 130 are formed on the substrate 126. On the package 120 shown in FIG. 6, two sets of bond pads 128 are formed on the controller die 124. A first set of bond pads 128a is located along a first edge 124a of the controller die 124. A second set of bond pads 128b is located along a second edge 124b of the controller die 124. The number of bond pads 128 shown in FIG. 6 is exemplary. Any number of bond pads 128 may be formed along one or more edges of the controller die 124. The substrate 126 has a first edge 138, a second edge 140, a third edge 142 and a fourth edge 144.

Each memory die 122 is electrically coupled to the substrate 126 by affixing bond wires 134 between the bond pads 128 on the memory die 122 and the contact pads 130. The controller die 124 is electrically coupled to the substrate 126 by affixing bond wires 132 (including wires 132a and 132b) between the bond pads 128 on the controller die 124 and the contact pads 130. The bond pads 128a are electrically coupled to the substrate 126 by affixing the bond wires 132a between the bond pads 128a and the contact pads 130. The bond pads 128b are electrically coupled to the substrate 126 by affixing the bond wires 132b between the bond pads 128b and the contact pads 130. The memory die 122, the controller die 124 and bond wires 132a, 132b and 134 are encapsulated in a molding compound 137 (FIG. 7) to seal the semiconductor package 120 and protect the die and bond wires. The molding compound 137 has a top surface 135.

Figure 4:
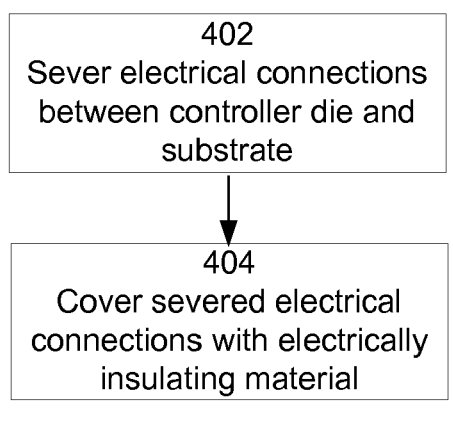
FIG. 4 depicts a flowchart displaying step 308 of FIG. 3 in greater detail.

In order to isolate the controller die 124 from the substrate 126 during the reclamation process, bond wires 132a and 132b are severed (step 402, FIG. 4). FIG. 6 illustrates that the bond wires 132a and 132b may be severed by passing a cutting tool (not shown) across the semiconductor package 120 along two separate cutting paths, cutting path A and cutting path B (each path shown by dashed lines). The cutting tool travels along cutting paths A and B, but cuts only deep enough into the molding compound 137 to sever the bond wires 132a and 132b that are electrically coupling the controller die 124 with the package substrate 126. The cutting tool does not cut into the memory die 122 or the bond wires 134 coupling the memory die 122 to substrate 126.

Cutting path A and cutting path B are shown as linear paths, though they need not be in alternative embodiments. In order to cut path A into the molding compound 137, the cutting tool makes a single pass across the semiconductor package 120. In order to cut path B into the molding compound 137, the cutting tool (either the same tool as made path A or another cutting tool) then makes another pass across the semiconductor package 120. Cutting path A is generally adjacent to and parallel with the edge 124a of the memory die 124. Cutting path A is offset from the second edge 140 of the substrate 126 by a distance d2. Cutting path B is generally adjacent to and parallel with the edge 124b of the controller die 124. The cutting path B is offset from the edge 138 by a distance d1.

Cutting path A and cutting path B may be made along the entire width and length of package 120, respectively. However, it is understood that the cutting path A and/or cutting path B may be made along only a portion of the width and/or length of the package 120 with the provision that the cutting paths A and B be sufficiently long to sever all of the bond wires connecting controller die 124 to substrate 126.

Figure 7:
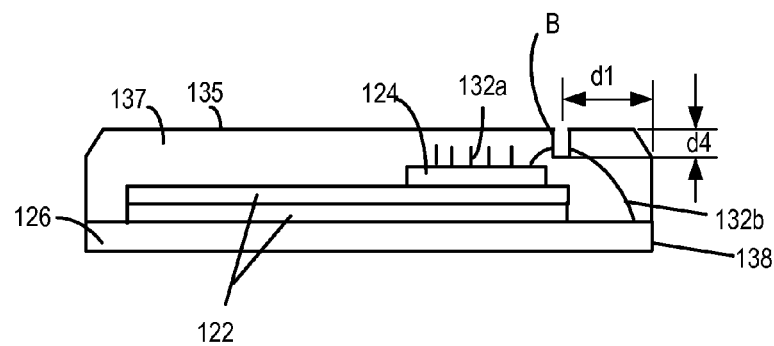
FIG. 7 depicts a cross-sectional side view of a semiconductor package that has been cut along path A shown in FIG. 6.

FIG. 7 illustrates the semiconductor package 120 with the molding compound 137 cut by the cutting tool (not shown) along cutting path A. FIG. 7 illustrates that the cutting tool has removed a portion of the molding compound 137. In this embodiment, the molding compound 137 has been cut along cutting path A to a depth d3. The depth d3 of the cut may vary, and may comprise any depth sufficient to sever the bond wires 132a between the controller die 124 and the substrate 126. Cutting a portion of the molding compound 137 along cutting path A severs the bond wires 132a electrically coupling the controller die 124 to the substrate 126, but does not sever the bond wires 134 electrically coupling the memory die 122 to the substrate 126. Cutting the molding compound along cutting path A also preferably does not cut or otherwise expose the passive component 129.

FIG. 8 illustrates the semiconductor package 120 with the molding compound 137 cut by a cutting tool along cutting path B of FIG. 6. FIG. 8 illustrates that the molding compound 137 has been cut along cutting path B to a depth d4. The depth d4 may vary, and may comprise any depth sufficient to sever the bond wires 132b electrically coupling the controller die 124 to the substrate 126. In the FIG. 6 embodiment, there are no bond wires 134 affixed between the memory die 122 and the substrate 126 along the first edge 138 of the substrate 126. Accordingly, cutting the top surface 135 of the molding compound 137 along path B does not run the risk of severing the bond wires 134 electrically coupling the memory die 122 to the substrate 126. However, in embodiments including bond wires from the memory die 122 along substrate edge 138, these bond wires are not affected by the cut along path B.

In one embodiment, the cutting tool comprises a semiconductor dicing saw blade. A blade having a thickness of, by way of example only, 1.0 mm is used to cut the molding compound 137 of the semiconductor package 120 along paths A and B. Such a thin blade ensures that the bond wires 132a and 132b will be severed despite a variation in the actual position of the controller die 124 with respect to one of the reference edges 138 or 140 due to package dimensional tolerances (typically +/−0.05 mm) and die-placement accuracy (typically +/−0.02 mm). A thin saw blade also limits the chance that the passive component 129 will be cut or exposed as a result of cutting the package along path A or path B. The width or thickness of the saw blade may vary in further embodiments.

In order to increase the efficiency of cutting each semiconductor package 120, multiple semiconductor packages 120 may be mounted and aligned on a tape or sawing jig in a predetermined matrix. Thus, a single pass of the cutting tool across the tape (or jig) will cut a path into the molding compound 137 of multiple semiconductor packages 120 along, for example, path A. The same would be true for cutting multiple packages 120 along path B or path C (explained below with respect to FIGS. 9 and 10). This would allow for the cutting process to be fully automated.

In an alternative embodiment, instead of a cutting blade, the cuts A, B or C may be made with a laser. A variety of lasers are known which can partially cut through molding compound 137 as described above, including for example $CO_2$ lasers, $YBO_4$ lasers, Argon lasers, etc. Such lasers are manufactured for example by Rofin-Sinar Technologies of Hamburg, Germany. Where the cuts A and B are made by a laser, the two cuts may be made in a single pass. That is, after severing the bond wires along a first edge of the controller die 124, the laser (or the jig holding the semiconductor package 120) may make a right angle turn so that the laser then severs the bond wires along the next adjacent edge.

The semiconductor package 120 may be cut along paths A and B in any order (e.g., path A first, then path B, or vice versa). Moreover, while die bond pads 128 are shown along only two edges, it is understood that any number of cuts may be used as described above to sever any and all bond wires from controller die bond pads whether those die bond pads are distributed along one, two, three or all four sides of the controller die 124. Furthermore, in high density applications, it is also known to redistribute some of the controller bond wires onto a second, dummy die using an RDL process. The redistributed electrical connections coupling the controller die to the substrate may also be severed with cuts as described above.

FIG. 9 illustrates an alternative embodiment in which a cutting tool severs the bond wires 132a and 132b between the controller die 124 and the substrate 126 in a single pass across the semiconductor package 120. The cutting path C has a width W, which may vary, but is generally wider than either cut path A or cut path B. The width W of cut path C may be wider or narrower than the controller die 124, but is sufficiently wide to sever the bond wires 132a and 132b along both edges 124a and 124b of the controller die 124. FIG. 9 illustrates that a first edge 152 of cutting path C is offset a distance d5 from the first edge 138 of the semiconductor package 120. A second edge 154 of cutting path C is offset a distance d6 from the reference edge 142. Cutting path C may be measured in reference to either the first edge 152 or the second edge 154 of cutting path C. FIG. 9 also illustrates that a cutting tool (not shown), cutting through the top surface 135 of the molding compound 137 along cutting path C, does not cut into or otherwise expose the passive component 129.

Figure 10:
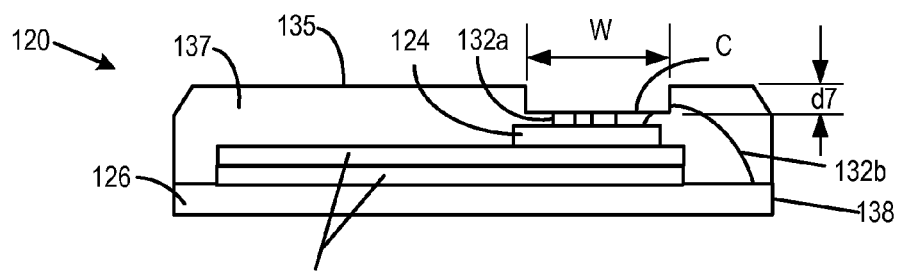
FIG. 10 depicts a cross-sectional side view of a semiconductor package that has been cut along path C shown in FIG. 9.

FIG. 10 illustrates the semiconductor package 120 after a cutting tool has cut through the molding compound 137 along cutting path C. The cutting tool is not required to cut the entire length or width of the semiconductor package 120. The cutting tool may cut partially across the semiconductor package 120 so long as all electrical connections from the controller die are severed. The cutting tool has cut into the top surface 135 of the molding compound 137 to a depth d7. The depth d7 of the cutting path C may vary, and may comprise any depth sufficient to sever the bond wires 132a and 132b. FIG. 10 illustrates that a cutting tool traveling along the path C severs both the bond wires 132a and 132b electrically connecting the controller die 124 to the substrate 126. Thus, one pass of a cutting tool across the semiconductor package 120 severs all bond wires 132 (132a and 132b) affixed between the bond pads 128 (first set 128a and second set 128b) and contact pads 130. As will be discussed in more detail later, a cutting tool traveling along path C does not sever the bond wires 134 electrically coupling the memory die 122 with the substrate 126. Cutting path C is shown along the length of package 120 (between edges 140 and 144). It is understood that cutting path C may alternatively be made across the width of package 120 in an alternative embodiment (between edges 138 and 142).

Figure 13:
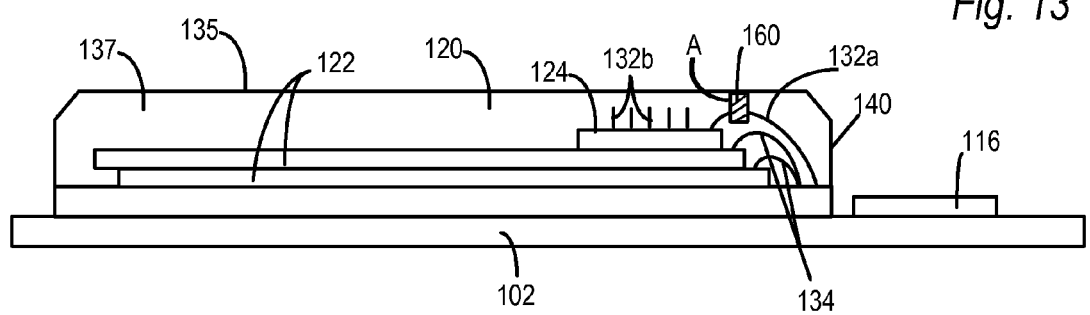
FIG. 13 depicts a side view of a new semiconductor package at another step in the fabrication process including a new controller die and a reclaimed semiconductor package affixed to the second substrate.
Figure 14:
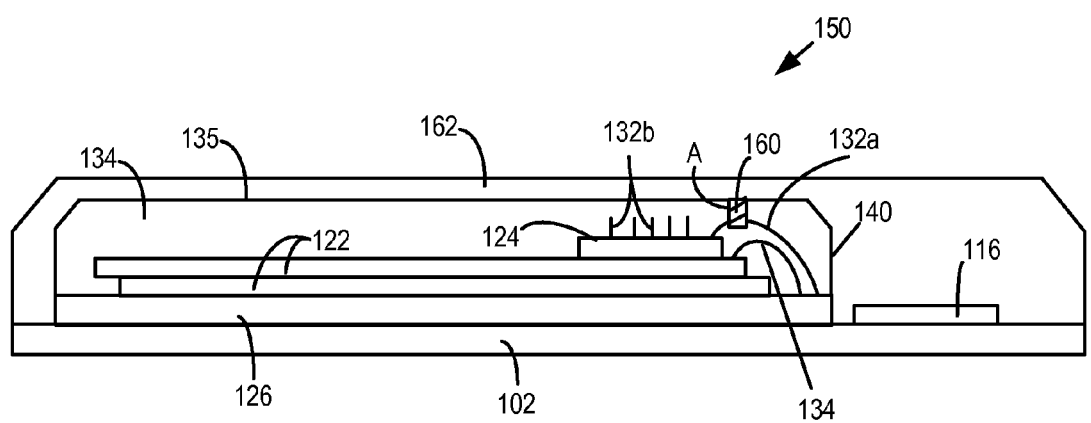
FIG. 14 depicts a cross-sectional side view of a new semiconductor package.

After the cutting tool has severed the bond wires 132a and 132b (either by cutting the molding compound 137 along path C or paths A and B), the controller die 124 is electrically isolated from the substrate 126. Referring again to the flowcharts of FIGS. 3 and 4, in addition to step 402 of severing electrical connections, the reclamation step 308 may further include the step 404 of sealing the cutting paths with an insulating material. In particular, as the bond wires are exposed along the edges of the cutting path, the cutting path may be backfilled with an electrically insulating material 160 (FIGS. 13 and 14). The insulating material 160 may be any of various dielectric inks or resins which harden, or which may be hardened, after being applied as a liquid. After the path is filled in with the electrically insulating material, the semiconductor package 120 may be referred to as a reclaimed package. At this point in the fabrication process, the reclaimed package includes operable memory die.

As explained below, the reclaimed semiconductor package is mounted on a substrate and then encapsulated. As such, in an alternative embodiment, it is conceivable that step 404 of sealing the cutting paths with an insulating material be omitted.

In step 310, the reclaimed flash memory package is subjected to an external visual inspection. After the flash memory package passes the external visual inspection, the memory die in the flash memory package is tested, in step 312. The memory die are tested to verify the integrity of the electrical connections between the memory die and the substrate (e.g., verify that the bond wires 134 between the memory die 122 and the substrate 126 were not severed during the reclaim process in step 308). In some applications, memory packages include only memory die and no controller die. Upon completion of step 310, the reclaimed semiconductor package 120 described above may then be used for such applications.

Figure 11:
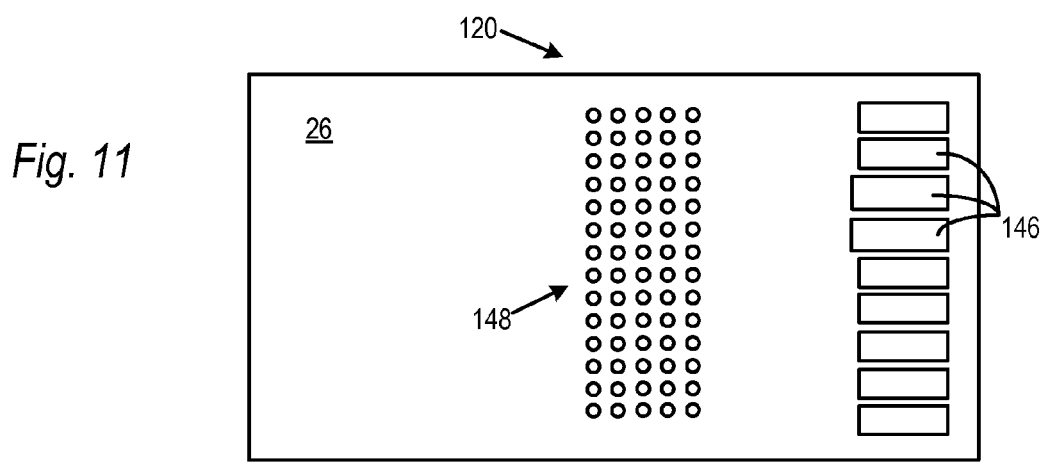
FIG. 11 is a bottom view of the semiconductor package of FIG. 9 showing the contact fingers and test pads.

For memory card applications including both memory die and a controller die, the reclaimed package 120 may be coupled with a new controller die on a new substrate and encapsulated. Such a memory card is now explained with reference to FIGS. 11-14. FIG. 11 is a bottom view of the reclaimed memory package 120 formed in step 308 as described above. In embodiments, the package from which reclaimed memory package was formed may have been an LGA package including contact fingers 146 for allowing communication between the former package and a host device. It is also understood that dedicated semiconductor packages, such as flip chip packages, may be reclaimed as described above. The contact fingers in such dedicated packages may be omitted. The bottom surface of memory package 120 may further include test pads 148 through which electrical testing of the package was performed.

Figure 12:
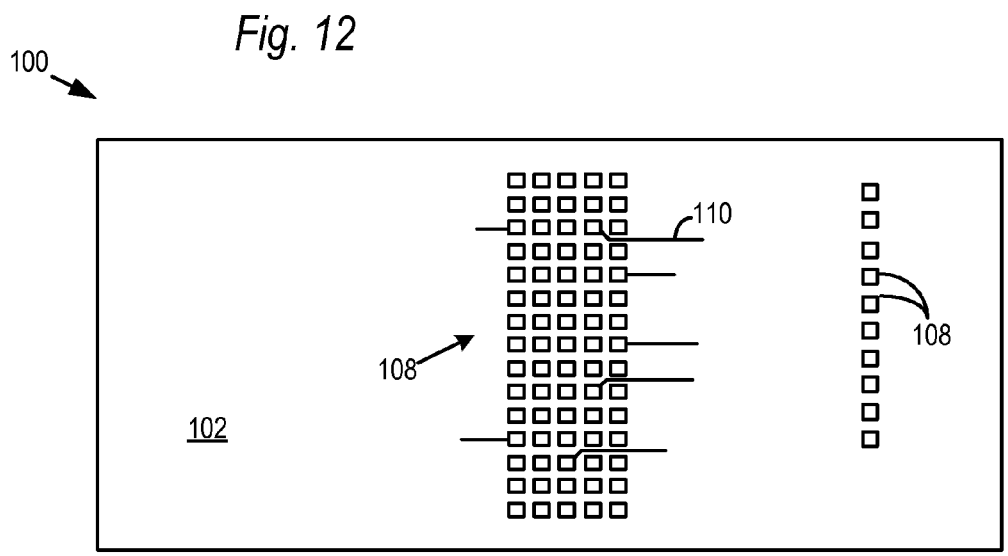
FIG. 12 depicts a top view of a new semiconductor package at a step in the fabrication process including a conductance pattern defined on a second substrate.

Referring now to the flowchart of FIG. 3 and the top and edge views of FIGS. 12 and 13, the reclaimed semiconductor package and a new, second controller die are each mounted to a second substrate 102 in a step 314. Substrate 102 may be of similar materials and construction to substrate 126 described above, but slightly larger to accommodate the reclaimed package 120, a new controller die and possibly other components.

Figure 5:
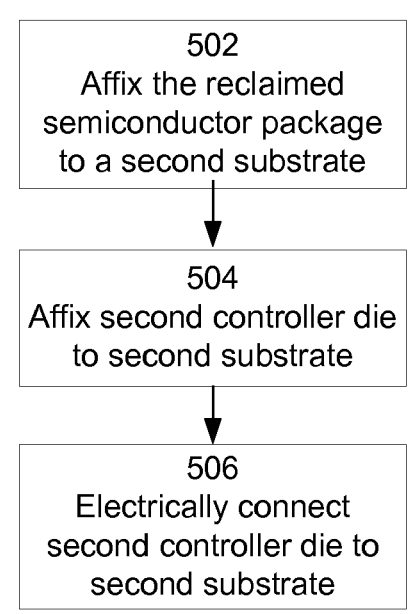
FIG. 5 depicts a flowchart displaying step 314 of FIG. 3 in greater detail.

Step 314 is explained in greater detail in the flowchart of FIG. 5. As the original electrical connections to the memory die 122 remain encapsulated within the reclaimed package 120, communication with the memory die of reclaimed package 120 is accomplished through the test pads 148 on the bottom surface of the reclaimed package 120. In particular, the reclaimed package 120 is electrically coupled to the second substrate 102 by surface mounting the test pads 148 of the reclaimed package 120 to contact pads 108 on the second substrate 102 in step 502. This may be accomplished by providing a solder bump on the contact pads 108 to be connected, aligning the test pads 148 on the contact pads 108, and reflowing the solder to form a permanent surface mounted electrical connection between the reclaimed package 120 and the new substrate 102.

It is understood that the number and configuration of test pads 148 and contact pads 108 is by way of example only, and each may vary in alternative embodiments. Moreover, there is no requirement that all test pads 148 be electrically connected to a contact pad 108. Substrate 102 may further include a conductance pattern defining electrical traces 110 (only some examples of which are shown) for transferring signals to and from the contact pads 108.

FIG. 13 shows a side view of the reclaimed package 120 surface mounted on substrate 102. A new controller die 116 may also be mounted to substrate 102 in step 504. The new controller die 116 may be electrically coupled to substrate 102 in step 506 by a variety of methods, including surface mounting, wire bonding or flip-chip bonding. The second controller die 116 may also be affixed to the second substrate 102 before mounting the reclaimed semiconductor package 120.

After the reclaimed semiconductor package 120 and the second controller die 116 are mounted to the second substrate 102, the reclaimed semiconductor package 120 and second controller die 116 are encapsulated within an electrically insulating molding compound 162 in step 316. The second substrate 102, with the reclaimed semiconductor package 130 and second controller die 116 affixed and encapsulated, comprises a new semiconductor package 150 as shown in FIG. 14.

In step 318, the new semiconductor package 150 may be lidded. The new flash memory card (package plus lid) may be electrically tested in step 320. Assuming the new flash memory card passes the test, the new flash memory card may be labeled in step 322 with the card and/or brand name and an identification number for the card. A final visual inspection may be conducted to check for scratches and discoloration in step 324. If the new flash memory card passes the inspection, the new flash memory card may then be shipped in step 328 to a supplier such as an original equipment manufacturer, retail store and the like for use with a third-party host device (e.g., digital camera).

The foregoing detailed description of the inventive system has been presented for purposes of illustration and description. It is not intended to be exhaustive or to limit the inventive system to the precise form disclosed. Many modifications and variations are possible in light of the above teaching. The described embodiments were chosen in order to best explain the principles of the inventive system and its practical application to thereby enable others skilled in the art to best utilize the inventive system in various embodiments and with various modifications as are suited to the particular use contemplated. It is intended that the scope of the inventive system be defined by the claims appended hereto.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

We claim:

1. A method of reclaiming a semiconductor package having a memory die and controller die each wire bonded to a package substrate, comprising steps of:
    (a) cutting through a portion of a surface of the package to sever bond wires electrically coupling the controller die with the package substrate without severing an electrical coupling between the memory die and the package substrate; and
    (b) covering the severed bond wires with an electrically insulating material.

2. The method as recited in claim 1, wherein said step (a) of cutting through a portion of a surface of the package to sever the bond wires electrically coupling the controller die to the package substrate comprises a step of cutting the semiconductor package along a linear path.

3. The method as recited in claim 2, wherein said step (a) of cutting through a portion of a surface of the package to sever the bond wires electrically coupling the controller die to the package substrate comprises a step of cutting the semiconductor package along a linear path having a width between 1.0 mm and 4.0 mm.

4. The method as recited in claim 2, further comprising a step of:
    (c) cleaning the linear path cut in the semiconductor package.

5. The method as recited in claim 1, wherein said step (a) of cutting through a portion of a surface of the package to sever the bond wires electrically coupling the controller die to the package substrate comprises steps of cutting the semiconductor package along a first path, the first path is offset from a first edge of the semiconductor package, and cutting the semiconductor package along a second path, the second path is offset from a second edge of the semiconductor package.

6. The method as recited in claim 5, wherein said step (b) of covering the severed bond wires with an electrically insulating material comprises a step of covering portions of the first path and second path cut in the semiconductor package with an electrically insulating ink.

7. The method as recited in claim 5, wherein said step (a) of cutting through a portion of a surface of the package to sever the bond wires electrically coupling the controller die with the package substrate comprises a step of cutting the second path in the semiconductor package substantially orthogonal to the first path cut in the semiconductor package.

8. The method as recited in claim 7, wherein said step (a) of cutting through a portion of a surface of the package to sever the bond wires electrically coupling the controller die with the package substrate comprises a step of cutting through the semiconductor package without affecting a capacitor in the semiconductor package.

9. The method as recited in claim 1, wherein said step (a) of cutting through a portion of a surface of the package to sever the bond wires electrically coupling the controller die with the package substrate comprises a step of cutting through a portion of the surface of the package with a semiconductor dicing saw blade.

10. The method as recited in claim 1, wherein said step (a) of cutting through a portion of a surface of the package to sever the bond wires electrically coupling the controller die with the package substrate comprises a step of cutting through a portion of the surface of the package with a laser.

11. The method as recited in claim 1, wherein said step (a) of cutting through a portion of a surface of the package to sever the bond wires electrically coupling the controller die with the package substrate comprises a step of cutting partially into a surface of the package to a depth and at a position where all bond wires along an edge of the controller die are severed without affecting other semiconductor die within the package.

12. The method as recited in claim 1, wherein said step (a) of cutting through a portion of a surface of the package to sever the bond wires electrically coupling the controller die with the package substrate comprises a step of cutting the package with a saw blade having a thickness sufficient to cut electrical bond wires along first and second orthogonal edges of the controller die in a single pass over the controller die.

13. A method of forming a semiconductor card, comprising:
    (a) reclaiming a semiconductor package having a memory die, a passive component, a substrate and a controller die by,
        (i) severing electrical connections between the controller die and the semiconductor package substrate without contacting the passive component using a saw blade;
        (ii) covering the semiconductor package with an electrically insulating material where the electrical connections between the controller die and the semiconductor package substrate were severed with the saw blade;
    (b) affixing the reclaimed semiconductor package to the surface of a second substrate to electrically couple the memory die of the reclaimed semiconductor package with the second substrate;
    (c) affixing a second controller die to the surface of the second substrate; and
    (d) encapsulating at least a portion of the second substrate with the second controller die and reclaimed semiconductor package affixed in a molding compound.

14. The method as recited in claim 13, wherein said step (c) of affixing the second controller die to the surface of the second substrate comprises a step of surface mounting the second controller die to the surface of the second substrate.

15. The method as recited in claim 14, wherein said step (c) of affixing the second controller die to the surface of the second substrate comprises a step of wirebonding the second controller die to the surface of the second substrate.

16. The method as recited in claim 13, wherein said step (b) of affixing the reclaimed semiconductor package to the surface of the second substrate comprises a step of affixing test pads of the reclaimed semiconductor package to the surface of the second substrate.

17. The method as recited in claim 16, wherein said step (b) of affixing the reclaimed semiconductor package to the surface of the second substrate comprises a step of surface mounting the test pads of the reclaimed semiconductor package to the surface of the second substrate.

18. The method as recited in claim 13, wherein said step (a)(i) of severing the electrical connections between the controller die and the semiconductor package substrate comprises a step of cutting bond wires electrically coupling the controller die to the semiconductor package substrate with the saw blade.

19. The method as recited in claim 13, wherein said step (a)(i) of severing the electrical connections between the controller die and the semiconductor package substrate comprises a step of cutting the semiconductor package along a path at a predetermined depth with the saw blade to sever the electrical connections between the controller die and the semiconductor package.

20. The method as recited in claim 19, wherein said step (a)(i) of severing the electrical connections between the controller die and the semiconductor package substrate comprises steps of cutting the semiconductor package along a first path to sever the electrical connections between the controller die and the semiconductor package along a first side of the controller die and cutting the semiconductor package along a second path to sever the electrical connections between the controller die and the semiconductor package along a second side of the controller die.

21. The method as recited in claim 13, wherein said step (a)(i) of severing the electrical connections between the controller die and the semiconductor package substrate comprises a step of cutting the semiconductor package with a semiconductor dicing saw.

22. The method as recited in claim 13, wherein said step (a)(i) of severing the electrical connections between the controller die and the semiconductor package substrate comprises a step of cutting partially into a surface of the package to a depth and at a position where all bond wires along an edge of the controller die are severed without affecting the memory die and capacitor within the semiconductor package.

23. The method as recited in claim 13, wherein said step (a)(i) of severing the electrical connections between the controller die and the semiconductor package substrate comprises a step of cutting the package with a saw blade having a thickness sufficient to cut electrical bond wires along first and second orthogonal edges of the controller die in a single pass over the controller die.

24. The method as recited in claim 13, wherein said step (a)(ii) of covering the semiconductor package with an electrically insulating material comprises a step of covering the semiconductor package with an electrically insulating ink where the electrical connections between the controller die and the semiconductor package substrate were severed with the saw blade.

* * * * *